(12) United States Patent
Watanabe et al.

(10) Patent No.: US 12,451,338 B2
(45) Date of Patent: Oct. 21, 2025

(54) PLASMA TREATMENT APPARATUS MEMBER

(71) Applicant: KYOCERA Corporation, Kyoto (JP)

(72) Inventors: Daiki Watanabe, Satsumasendai (JP);
Miki Hamada, Satsumasendai (JP);
Yuusaku Ishimine, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 116 days.

(21) Appl. No.: 18/570,565

(22) PCT Filed: Jun. 9, 2022

(86) PCT No.: PCT/JP2022/023350
§ 371 (c)(1),
(2) Date: Dec. 14, 2023

(87) PCT Pub. No.: WO2022/264922
PCT Pub. Date: Dec. 22, 2022

(65) Prior Publication Data
US 2024/0290582 A1  Aug. 29, 2024

(30) Foreign Application Priority Data
Jun. 15, 2021   (JP) ................... 2021-099573

(51) Int. Cl.
*H01J 37/32*   (2006.01)

(52) U.S. Cl.
CPC .. *H01J 37/32724* (2013.01); *H01J 37/32449* (2013.01); *H01J 37/32568* (2013.01); *H01J 37/32651* (2013.01)

(58) Field of Classification Search
None
See application file for complete search history.

(56) References Cited

U.S. PATENT DOCUMENTS

| | | | |
|---|---|---|---|
| 6,717,116 B1* | 4/2004 | Ito | H01L 21/6831 219/444.1 |
| 10,535,545 B2* | 1/2020 | Harayama | H01L 21/6833 |
| 11,417,558 B2* | 8/2022 | Minemura | H01L 21/4857 |
| 11,574,822 B2* | 2/2023 | Unno | H01J 37/32724 |

(Continued)

FOREIGN PATENT DOCUMENTS

| | | |
|---|---|---|
| JP | 2002-057207 A | 2/2002 |
| JP | 2002-373862 A | 12/2002 |

(Continued)

*Primary Examiner* — Kenneth B Wells
(74) *Attorney, Agent, or Firm* — Procopio, Cory, Hargreaves & Savitch LLP

(57) ABSTRACT

A plasma treatment apparatus member according to the present disclosure includes a base, a plasma electrode, a heating element, and a conductive layer. The base is made of a ceramic and has a facing surface facing an object to be processed. The plasma electrode is located inside the base. The heating element and the conductive layer are located farther from the facing surface than the plasma electrode are, inside the base. The heating element and the conductive layer do not overlap each other in plan view seen from a direction orthogonal to the facing surface, and are located at different heights in side view seen from a direction parallel to the facing surface.

13 Claims, 6 Drawing Sheets

(56) References Cited

U.S. PATENT DOCUMENTS

| | | | |
|---|---|---|---|
| 11,764,039 B2 * | 9/2023 | Takahashi | H01L 21/68735 |
| | | | 219/444.1 |
| 2002/0007911 A1 | 1/2002 | Kuibira et al. | |
| 2006/0087211 A1 | 4/2006 | Kishimoto et al. | |
| 2008/0236493 A1 | 10/2008 | Sakao | |
| 2017/0306494 A1 | 10/2017 | Lin et al. | |
| 2018/0218885 A1 | 8/2018 | Maeda et al. | |
| 2019/0348316 A1 | 11/2019 | Hayashi | |
| 2021/0217638 A1 | 7/2021 | Hanamachi et al. | |

FOREIGN PATENT DOCUMENTS

| | | |
|---|---|---|
| JP | 2006-120926 A | 5/2008 |
| JP | 2008-244145 A | 10/2008 |
| JP | 2018-123348 A | 8/2018 |
| JP | 2019-197830 A | 11/2019 |
| JP | 2019-220282 A | 12/2019 |
| JP | 2020-064841 A | 4/2020 |
| WO | 2020/055565 A1 | 3/2020 |

* cited by examiner

PLASMA TREATMENT APPARATUS MEMBER

CROSS-REFERENCE TO RELATED APPLICATIONS

This application is national stage application of International Application No. PCT/JP2022/023350, filed on Jun. 9, 2022, which designates the United States, incorporated herein by reference, and which claims the benefit of priority from Japanese Patent Application No. 2021-099573, filed on Jun. 15, 2021, the entire contents of which are incorporated herein by reference.

TECHNICAL FIELD

The present disclosure relates to a plasma treatment apparatus member.

BACKGROUND OF INVENTION

There has been known a plasma treatment apparatus that processes a substrate such as a semiconductor wafer using plasma. The plasma treatment apparatus includes a substrate support that supports the substrate, and a shower head that is located above the substrate support and supplies a process gas. Such a plasma treatment apparatus generates plasma of a process gas in a treatment space between the substrate support and the shower head, thus processing the substrate supported by the substrate support.

CITATION LIST

Patent Literature

Patent Document 1: JP 2008-244145 A

SUMMARY

A plasma treatment apparatus member according to an aspect of the present disclosure includes a base, a plasma electrode, a heating element, and a conductive layer. The base is made of a ceramic and has a facing surface facing an object to be processed. The plasma electrode is located inside the base. The heating element and the conductive layer are located farther from the facing surface than the plasma electrode is, inside the base. The heating element and the conductive layer do not overlap each other in plan view seen from a direction orthogonal to the facing surface, and are located at different heights in side view seen from a direction parallel to the facing surface.

DESCRIPTION OF EMBODIMENTS

Modes (hereinafter referred to as "embodiments") for implementing a plasma treatment apparatus member according to the present disclosure will be described in detail below with reference to the attached drawings. The embodiments are not intended to limit the plasma treatment apparatus member according to the present disclosure. Embodiments can be appropriately combined so as not to contradict each other in terms of processing content. In the following embodiments, the same portions are denoted by the same reference signs, and overlapping explanations are omitted.

In the embodiments described below, expressions such as "constant", "orthogonal", "perpendicular", and "parallel" may be used, but these expressions do not need to be exactly "constant", "orthogonal", "perpendicular", and "parallel". In other words, it is assumed that the above expressions allow deviations in manufacturing accuracy, installation accuracy, or the like.

The drawings referenced below are schematic for illustrative purposes only. Therefore, the details may be omitted, and dimension ratios do not necessarily correspond to actual ones.

In each of the drawings referred to below, for ease of explanation, an X-axis direction, a Y-axis direction, and a Z-axis direction that are orthogonal to each other may be defined to illustrate a rectangular coordinate system in which the Z-axis positive direction is the vertically upward direction.

Patent Document 1 discloses a technique that uses a heater line connecting a heater provided inside an electrostatic chuck to a heater power supply, as a high-frequency leakage line. However, the technique described in Patent Document 1 is insufficient as a countermeasure against leakage current. Therefore, a plasma treatment apparatus member capable of suppressing the generation of leakage current is desired to be provided.

Hereinafter, an example in which a plasma treatment apparatus member according to the present disclosure is applied to a substrate support is described as a first embodiment. Subsequently, an example in which a plasma treatment apparatus member according to the present disclosure is applied to a shower head is described as a second embodiment.

First Embodiment

Figure 1:
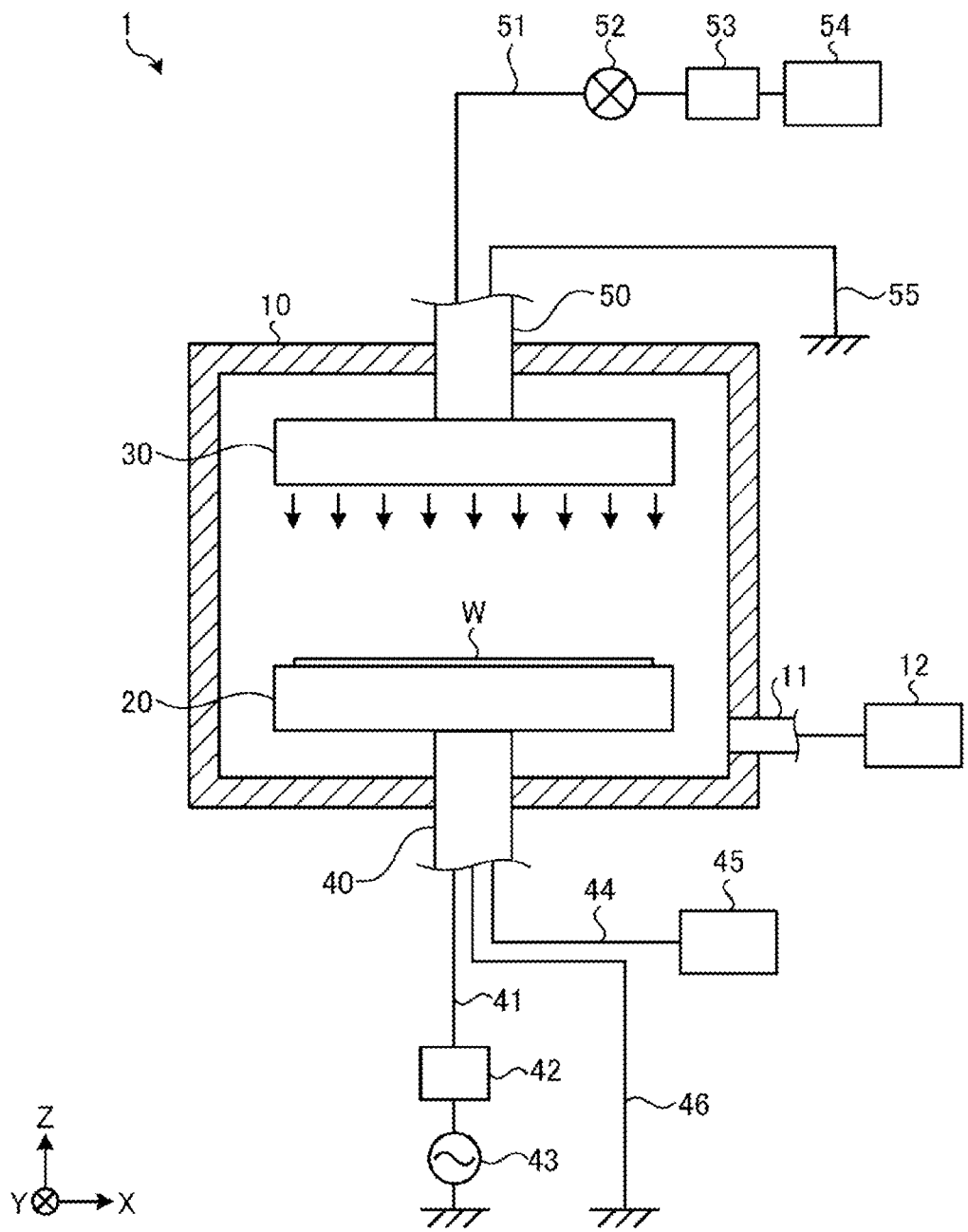
FIG. 1 is a schematic diagram illustrating a configuration of a plasma treatment apparatus according to a first embodiment.

First, a configuration of a plasma treatment apparatus according to a first embodiment is described with reference to FIG. 1. FIG. 1 is a schematic diagram illustrating a configuration of the plasma treatment apparatus according to the first embodiment. As illustrated in FIG. 1, the plasma treatment apparatus 1 according to the first embodiment includes a chamber 10, a substrate support 20, and a shower head 30.

Hereinafter, an example in which the plasma treatment apparatus 1 is a plasma treatment apparatus of a type in which a high-frequency (RF) power is applied only to the substrate support 20, of the substrate support 20 and the shower head 30, is described, but the configuration of the plasma treatment apparatus 1 is not limited to this example. For example, the plasma treatment apparatus 1 may be of a type in which high-frequency power is applied to both the substrate support 20 and the shower head 30. In addition, the following example describes the plasma treatment apparatus 1 of a type that generates plasma using high-frequency power, but the power used for generation of plasma is not necessarily high-frequency power.

The chamber 10 is a container that accommodates the substrate support 20 and the shower head 30. To the chamber 10, an exhaust device 12 is connected via an exhaust pipe 11. The exhaust device 12 includes, for example, a vacuum pump such as a turbo-molecular pump and thus can depressurize the inside of the chamber 10 to a desired degree of vacuum. Although not illustrated herein, a carry-in/out port of a substrate W such as a semiconductor wafer may be located in a sidewall of the chamber 10. In this case, the carry-in/out port can be opened and closed by a gate valve.

The substrate support 20 is a member that supports the substrate W, and is supported horizontally from below by, for example, a hollow shaft 40. The substrate W is supported on the upper surface of the substrate support 20.

A plasma electrode, a heating element, and a conductive layer are located inside the substrate support 20. The plasma electrode among them is connected to a high-frequency power supply 43 via a power supply member 41 and a matcher 42. The matcher 42 is a circuit for matching the output impedance of the high-frequency power supply 43 with the input impedance of the load side, that is, the plasma electrode side. The high-frequency power generated by the high-frequency power supply 43 is supplied to the plasma electrode via the matcher 42 and the power supply member 41.

The heating element is connected to a heater power supply 45 via a power supply member 44. The power supplied to the heating element from the heater power supply 45 can heat the substrate W supported on the substrate support 20.

The conductive layer functions as a shield member that blocks an electric field generated by the plasma electrode. Such a conductive layer is grounded via a conductive member 46. This enables more reliable blocking of the electric field generated by the plasma electrode. The conductive layer need not necessarily be grounded.

The power supply members 41, 44 and the conductive member 46 are inserted into a hollow portion of the shaft 40.

The shower head 30 is horizontally supported from above by a shaft 50 above the substrate support 20. A lower surface of the shower head 30 faces the upper surface of the substrate support 20.

A process gas supply source 54 is connected to the shower head 30 via a gas supply pipe 51, an opening/closing valve 52, and a flow rate controller 53. The process gas supplied from the process gas supply source 54 is supplied into the chamber 10 through a plurality of ejection holes opened in the lower surface of the shower head 30.

A plasma electrode is located inside the shower head 30. The plasma electrode is grounded via a conductive member 55.

The shafts 40, 50 have, for example, a tubular shape with both ends opened. The shafts 40, 50 are respectively bonded to the substrate support 20 and the shower head 30 with, for example, an adhesive. Thus, the substrate support 20 and the shower head 30 are bonded. In another mode, the shafts 40, 50 may be bonded respectively to the substrate support 20 and the shower head 30 by solid-phase bonding. The shafts 40, 50 may have any shape. In one mode, the shafts 40, 50 have a circular tube shape. In another mode, the shafts 40, 50 may have, for example, a rectangular tube shape.

The shafts 40, 50 are made of any material. In one mode, the shafts 40, 50 may be made of an insulating ceramic material. In another mode, the shafts 40, 50 may be made of, for example, a conductive material such as a metal. A ceramic of the shafts 40, 50 may be a sintered body including, as a main component, aluminum nitride (AlN), aluminum oxide ($Al_2O_3$, alumina), silicon carbide (SiC), silicon nitride ($Si_3N_4$), or the like.

Figure 2:
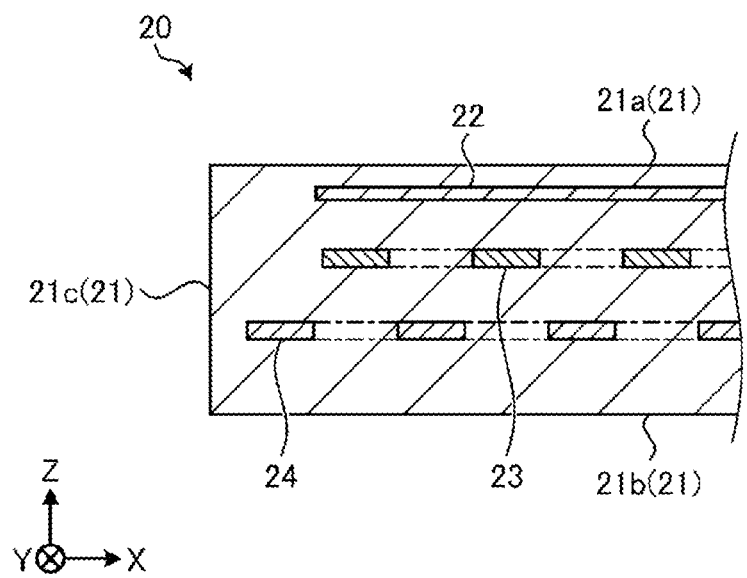
FIG. 2 is a schematic cross-sectional view illustrating a configuration of a substrate support according to the first embodiment.
Figure 3:
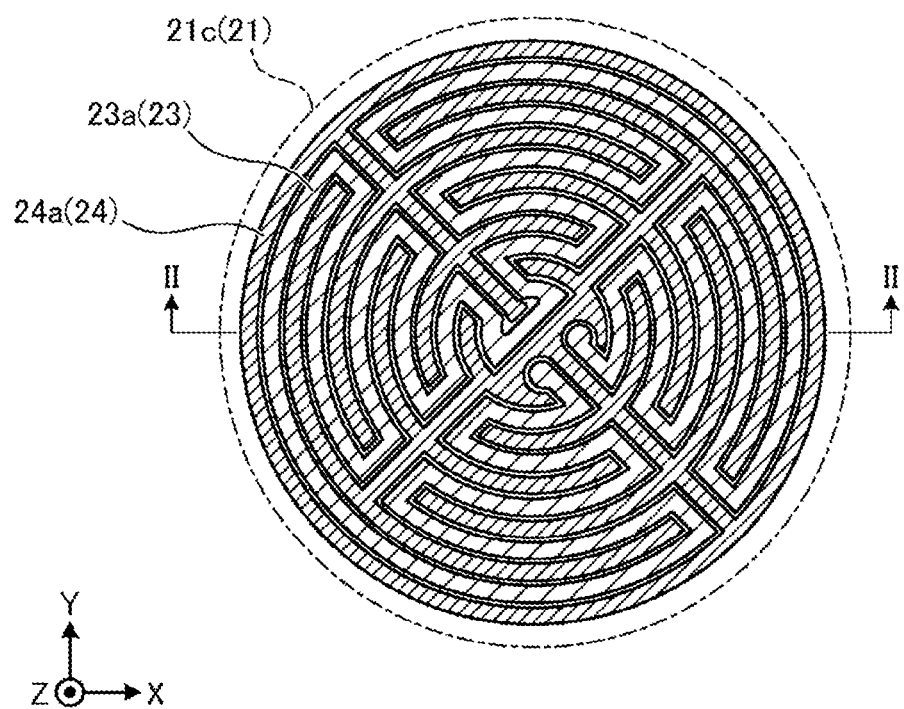
FIG. 3 is a perspective plan view of the substrate support according to the first embodiment when seen from above.

Next, a specific configuration of the substrate support 20 according to the first embodiment is described with reference to FIGS. 2 and 3. FIG. 2 is a schematic cross-sectional view illustrating a configuration of the substrate support 20 according to the first embodiment. FIG. 3 is a perspective plan view of the substrate support 20 according to the first embodiment viewed from above. The cross-sectional view illustrated in FIG. 2 corresponds to a cross-sectional view taken along, for example, line II-II of FIG. 3.

As illustrated in FIG. 2, the substrate support 20 includes a base 21, a plasma electrode 22, a heating element 23, and a conductive layer 24.

The base 21 is made of, for example, a ceramic and has an insulation property. The ceramic constituting the base 21 may be a sintered body including, as a main component, aluminum nitride (AlN), aluminum oxide ($Al_2O_3$, alumina), silicon carbide (SiC), silicon nitride ($Si_3N_4$), or the like. The main component accounts for, for example, 50 mass % or more or 80 mass % or more of the material. When the main component of the base 21 is aluminum nitride, the base 21 may include a compound of yttrium (Y). Examples of the Y compound include YAG ($Y_3Al_5O_{12}$) and $Y_2O_3$.

The substrate W (see FIG. 1) is placed on an upper surface 21a of the base 21. The upper surface 21a of the base 21 corresponds to a surface facing the substrate W. The substrate W is an example of an object to be processed.

The base 21 has any shape. For example, in the first embodiment, the shape of the base 21 is circular in plan view, but it is not limited thereto and may be elliptical, rectangular, trapezoidal, or the like in plan view. The upper surface 21a of the base 21 may be a uniform flat surface, or may be provided with a groove portion, a step, or the like.

The plasma electrode 22, the heating element 23, and the conductive layer 24 are located inside the base 21. The plasma electrode 22 is an electrode for generating plasma and extends as a layer along the upper surface 21a of the base 21. The plasma electrode 22 has, for example, a disk shape in plan view.

The plasma electrode 22 is made of, for example, a metal such as nickel (Ni), tungsten (W), titanium (Ti), molybdenum (Mo), platinum (Pt), or the like, or an alloy including at least one of these metals.

The heating element 23 generates heat by Joule heat generated by electric power supplied from the heater power supply 45 via the power supply member 44. The heating element 23 extends as a layer along the upper surface 21a of the base 21. Specifically, the heating element 23 extends having a circular outer shape in plan view while drawing a predetermined pattern such as a meander shape (see FIG. 3) or a spiral shape.

The heating element 23 is made of, for example, a metal such as nickel (Ni), tungsten (W), molybdenum (Mo), platinum (Pt), or the like, or an alloy including at least one of these metals.

The conductive layer 24 functions as an electric field shield that blocks the electric field generated by the plasma electrode 22. The conductive layer 24 extends as a layer along the upper surface 21a of the base 21. Specifically, the conductive layer 24 extends having a circular outer shape in plan view while drawing a predetermined pattern.

The conductive layer 24 is made of, for example, a metal such as nickel (Ni), tungsten (W), molybdenum (Mo), platinum (Pt), or the like, or an alloy including at least one of these metals.

As illustrated in FIG. 2, in an example, the plasma electrode 22, the heating element 23, and the conductive layer 24 are located in this order in the depth direction with respect to the upper surface 21a of the base 21, that is, from the upper surface 21a to the lower surface 21b of the base 21. In other words, the heating element 23 and the conductive layer 24 are located at different heights in side view seen from a direction parallel to the upper surface 21a of the base 21.

In addition, as illustrated in FIG. 3, when the heating element 23 and the conductive layer 24 are viewed in plan view, a pattern shape (second pattern shape) of the conductive layer 24 is positioned in gaps in a pattern shape (first pattern shape) of the heating element 23, for example.

Specifically, a metal wiring line constituting the heating element 23 extends while drawing the first pattern shape. The first pattern shape is, for example, a meander shape. A metal wiring line constituting the conductive layer 24 is located in gaps between portions of the metal wiring line constituting the heating element 23. Thus, the metal wiring line constituting the conductive layer 24 extends along the gaps between portions of the metal wiring line constituting the heating element 23 to form the second pattern shape. The first pattern shape is formed by so-called unicursal writing including no branch, whereas the second pattern shape includes a plurality of branches.

As described above, in the substrate support 20 according to the first embodiment, the heating element 23 and the conductive layer 24 do not overlap each other in plan view. In other words, the conductive layer 24 according to the first embodiment is located in a region other than the region where the heating element 23 is located in plan view. The heating element 23 and the conductive layer 24 are located at different heights in side view.

This configuration makes it difficult to generate leakage current between the heating element 23 and the conductive layer 24 due to a long distance between the heating element 23 and the conductive layer 24, as compared with a case in which the heating element 23 and the conductive layer 24 overlap in plan view. Accordingly, the substrate support 20 according to the first embodiment can suppress the generation of leakage current. Suppressing the generation of leakage current further stabilizes the electrical characteristics of the substrate support 20. Thus, the substrate support 20 according to the first embodiment can enhance the reliability of the substrate support 20.

The substrate support 20 can block the electric field generated by the plasma electrode 22, with use of the heating element 23 and the conductive layer 24. In other words, the substrate support 20 can block the electric field generated by the plasma electrode 22, with use of the heating element 23, and block the electric field leaking from the gaps between portions of the metal wiring line constituting the heating element 23, with use of the conductive layer 24. As described above, the conductive layer 24 is formed having a predetermined pattern shape so as not to overlap the heating element 23 in plan view. Therefore, the substrate support 20 according to the first embodiment can maintain the function as the electric field shield while lowering the material cost of the conductive layer 24 as compared with a case in which the conductive layer 24 is formed having a uniform flat plate shape.

As illustrated in FIG. 3, the conductive layer 24 may include an outer peripheral portion 24a located on the outermost side in a direction parallel to the upper surface 21a of the base 21 (a planar direction of the base 21). In an example, the conductive layer 24 may include a plurality of curved portions arranged concentrically. The curved portions may have an arc shape or a circumferential shape. The outer peripheral portion 24a may be a curved portion located on the outermost side of the curved portions in the planar direction of the base 21. Similarly, the heating element 23 may include an outer peripheral portion 23a located on the outermost side in a direction parallel to the upper surface 21a of the base 21, that is, in the planar direction of the base 21. In an example, the heating element 23 may include a plurality of arc-shaped curved portions arranged concentrically. In this case, the outer peripheral portion 23a may be a curved portion located on the outermost side of the curved portions in the planar direction of the base 21.

In plan view, the outer peripheral portion 24a of the conductive layer 24 may be located on an outer side of the outer peripheral portion 23a of the heating element 23. In other words, the outer peripheral portion 24a of the conductive layer 24 may be located closer to the side surface 21c of the base 21 than the outer peripheral portion 23a of the heating element 23 is.

Such a configuration is more effective in eliminating electric charges accumulating in the outer peripheral portion of the base 21 than a case in which, for example, the outer peripheral portion 24a of the conductive layer 24 is located further inward of the base 21 than the outer peripheral portion 23a of the heating element 23. This can further stabilize the electrical characteristics of the substrate support 20 and enhance the reliability of the substrate support 20.

In addition, as illustrated in FIG. 2, the outer peripheral portion 24a of the conductive layer 24 may be located on an outer side of the outer peripheral portion of the plasma electrode 22. In other words, the outer peripheral portion 24a of the conductive layer 24 may be located closer to the side surface 21c of the base 21 than the outer peripheral portion of the plasma electrode 22 is.

Such a configuration allows appropriate blocking of the electric field radiating from the plasma electrode 22.

As described above, the heating element 23 and the conductive layer 24 are located in this order in the depth direction with respect to the upper surface 21a of the base 21. In other words, the heating element 23 is located closer to the upper surface 21a of the base 21 than the conductive layer 24 is. This allows more efficient heating of the substrate W placed on the upper surface 21a of the base 21 than a case in which, for example, the heating element 23 and the conductive layer 24 are located in order of the conductive layer 24 and the heating element 23 in the depth direction of the base 21.

Manufacturing Method of Substrate Support

Next, an example of a manufacturing method of the substrate support 20 according to the first embodiment is described. In an example, the substrate support 20 is formed by layering a plurality of sheets. Specifically, a ceramic green sheet constituting the base 21, a metal sheet constituting the plasma electrode 22, a metal sheet constituting the heating element 23, and a metal sheet constituting the conductive layer 24 are prepared. Subsequently, the prepared sheets are layered. The ceramic green sheet located in the same layer as the metal sheets of the plasma electrode 22, the heating element 23, and the conductive layer 24 are die-cut matching the shapes of the metal sheets, and the metal sheets are located in the die-cut portions.

Subsequently, a laminate body of the ceramic green sheet and the metal sheets is degreased and sintered. The sintering temperature is, for example, equal to or higher than 1100° C. and equal to or lower than 1850° C. Subsequently, holes for inserting the connection terminals of the power supply members 41, 44 and the conductive member 46 are formed in the sintered laminate body by drilling or the like, and then the terminals are inserted into the formed holes and bonded to the laminate body via a bonding layer. Subsequently, the conductive material is sintered by thermal treatment of the laminate body to which the terminals are attached in a vacuum. The thermal treatment temperature here is, for example, equal to or higher than 500° C. and equal to or lower than 800° C. Thus, the substrate support 20 is obtained.

Although the metal sheets are used here to form the plasma electrode 22, the heating element 23, and the conductive layer 24, metal paste, wires, or the like may be used instead of the metal sheets.

Variation of First Embodiment

In the first embodiment described above, the example is described in which the heating element 23 and the conductive layer 24 are parallel to the upper surface 21a of the base 21. However, the heating element 23 and the conductive layer 24 do not necessarily need to be parallel to the upper surface 21a of the base 21. For example, the heating element 23 or the conductive layer 24 may be warped with respect to the upper surface 21a of the base 21.

Hereinafter, examples in which the heating element 23 or the conductive layer 24 is warped with respect to the upper surface 21a of the base 21 is described with reference to FIGS. 4 to 7. FIGS. 4 to 7 are schematic cross-sectional views each illustrating another configuration example of the substrate support 20 according to the first embodiment.

Figure 4:
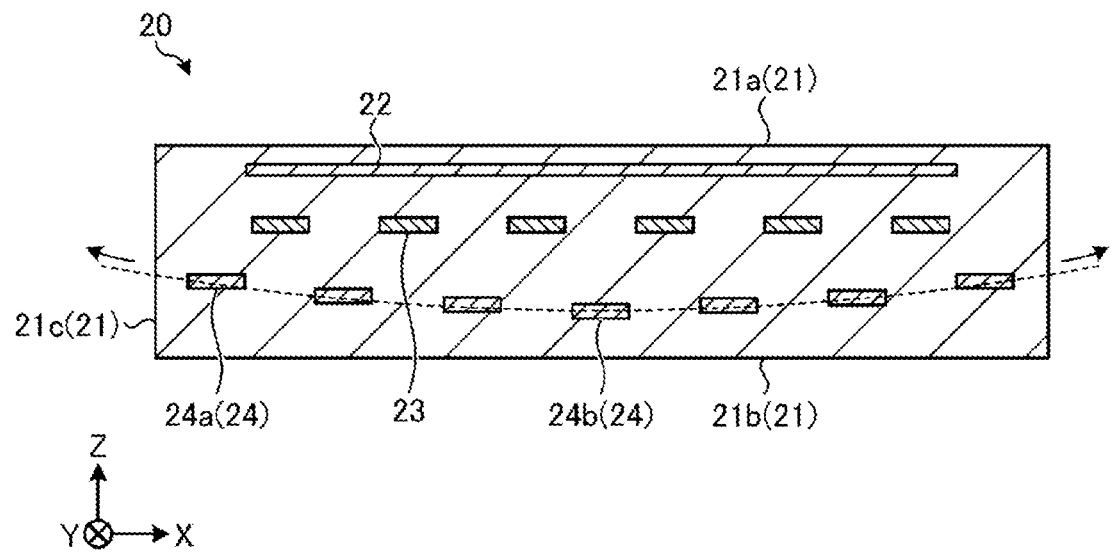
FIG. 4 is a schematic cross-sectional view illustrating another configuration example of the substrate support according to the first embodiment.

As illustrated in FIG. 4, the conductive layer 24 may include a central portion 24b located at the centermost position in the direction parallel to the upper surface 21a of the base 21, that is, in the planar direction of the base 21. In an example, the conductive layer 24 may include a plurality of curved portions arranged concentrically (see FIG. 3). In this case, of these curved portions, the central portion 24b may be a curved portion located at the centermost position in the planar direction of the base 21, or a portion located closer to the center side of the base 21 than the curved portion located at the centermost position is.

As illustrated in FIG. 4, the outer peripheral portion 24a of the conductive layer 24 may be located closer to the upper surface 21a of the base 21 than the central portion 24b is, in the thickness direction of the base 21.

Such a configuration can block the electric field radiating from the plasma electrode 22 more appropriately. Since the distance between the heating element 23 and the conductive layer 24 is large in the central portion 24b of the conductive layer 24, the generation of leakage current in the central portion 24b of the conductive layer 24 can be preferably suppressed.

Figure 5:
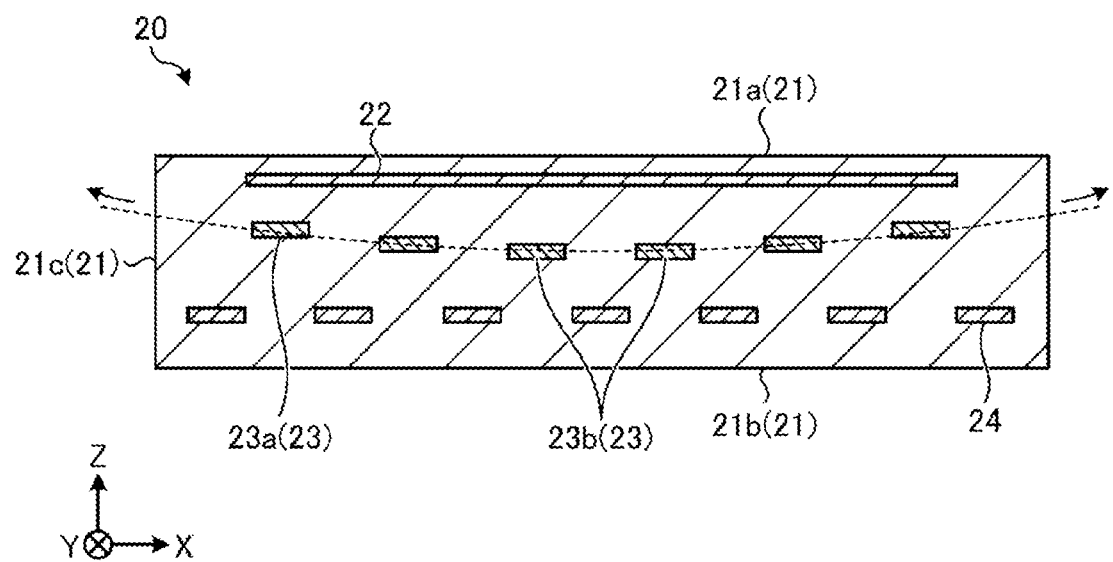
FIG. 5 is a schematic cross-sectional view illustrating another configuration example of the substrate support according to the first embodiment.

As illustrated in FIG. 5, the heating element 23 may include a central portion 23b located at the centermost position in the direction parallel to the upper surface 21a of the base 21, that is, in the planar direction of the base 21. In an example, the heating element 23 may include a plurality of curved portions arranged concentrically (see FIG. 3). In this case, of these curved portions, the central portion 23b may be a curved portion located at the centermost position in the planar direction of the base 21, or a portion located closer to the center side of the base 21 than the curved portion located at the centermost position is.

As illustrated in FIG. 5, the outer peripheral portion 23a of the heating element 23 may be located closer to the upper surface 21a of the base 21 than the central portion 23b is, in the thickness direction of the base 21.

Since the distance between the heating element 23 and the conductive layer 24 is large in the central portion 23b of the heating element 23 in such a configuration, the generation of leakage current at the outer peripheral portion 23a of the heating element 23 can be preferably suppressed.

Figure 6:
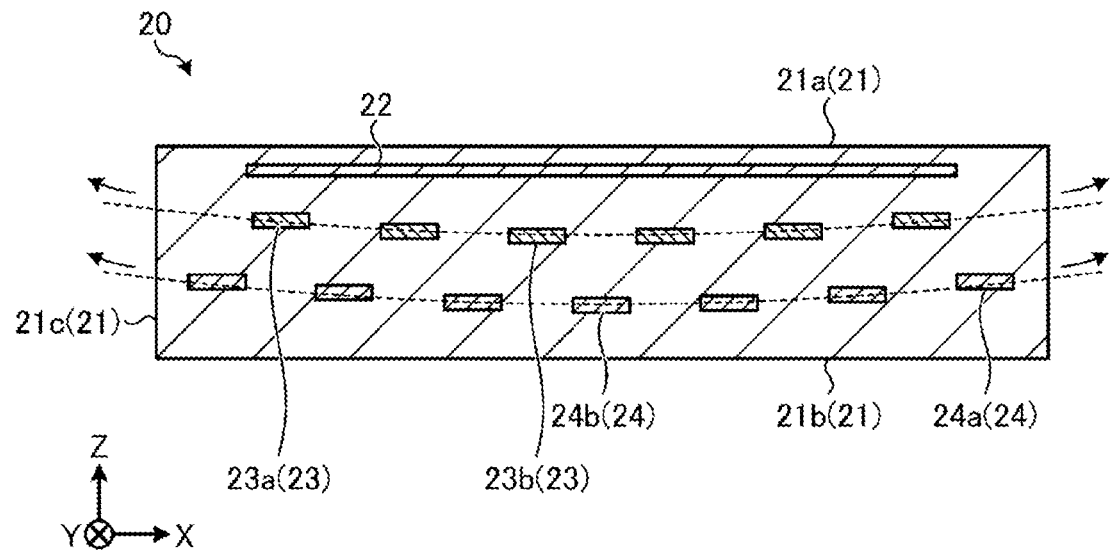
FIG. 6 is a schematic cross-sectional view illustrating another configuration example of the substrate support according to the first embodiment.

As illustrated in FIG. 6, both the heating element 23 and the conductive layer 24 may be warped. In other words, in the heating element 23 and the conductive layer 24, the outer peripheral portions 23a, 24a may be located closer to the upper surface 21a of the base 21 than the central portions 23b, 24b are, in the thickness direction of the base 21.

Since the heating element 23 and the conductive layer 24 are similarly warped in such a configuration, a reduction in part of the distance between the heating element 23 and the conductive layer 24 can be suppressed. This preferably suppresses leakage current between the heating element 23 and the conductive layer 24 while appropriately blocking the electric field radiating from the plasma electrode 22.

Figure 7:
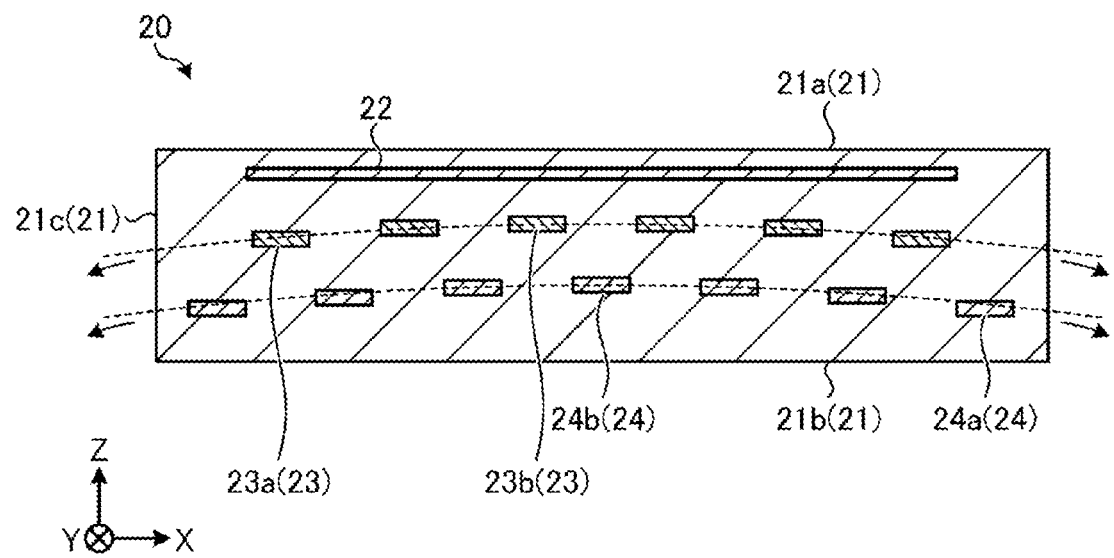
FIG. 7 is a schematic cross-sectional view illustrating another configuration example of the substrate support according to the first embodiment.

As illustrated in FIG. 7, in the heating element 23 and the conductive layer 24, the central portions 23b, 24b may be located closer to the upper surface 21a of the base 21 than the outer peripheral portions 23a, 24a are, in the thickness direction of the base 21.

The direction of warpage of the heating element 23 and conductive layer 24 is not limited to the examples illustrated in FIGS. 4 to 7. For example, the heating element 23 and the conductive layer 24 may be warped in opposite directions to each other. In other words, the heating element 23 and the conductive layer 24 may be warped such that the central portions 23b, 24b become close to each other or the outer peripheral portions 23a, 24a become close to each other.

For example, in manufacturing the substrate support 20 according to the variation, a ceramic sheet which is die-cut for a metal sheet portion is layered on top of a ceramic sheet which is not die-cut, that is, a solid ceramic sheet. Then, the portion die-cut in the shape of the metal sheet (hereinafter referred to as "die-cut portion") is partially increased in bulk by being filled with ceramic powder or the like. Subsequently, a metal sheet is placed on the die-cut portion. Thus, when, for example, the outer peripheral portion of the die-cut portion is increased in bulk, the heating element 23 or the conductive layer 24 as illustrated in FIGS. 4 to 6 can be obtained. When the central portion of the die-cut portion is increased in bulk, the heating element 23 or the conductive layer 24 can be obtained as illustrated in FIG. 7.

Second Embodiment

Figure 8:
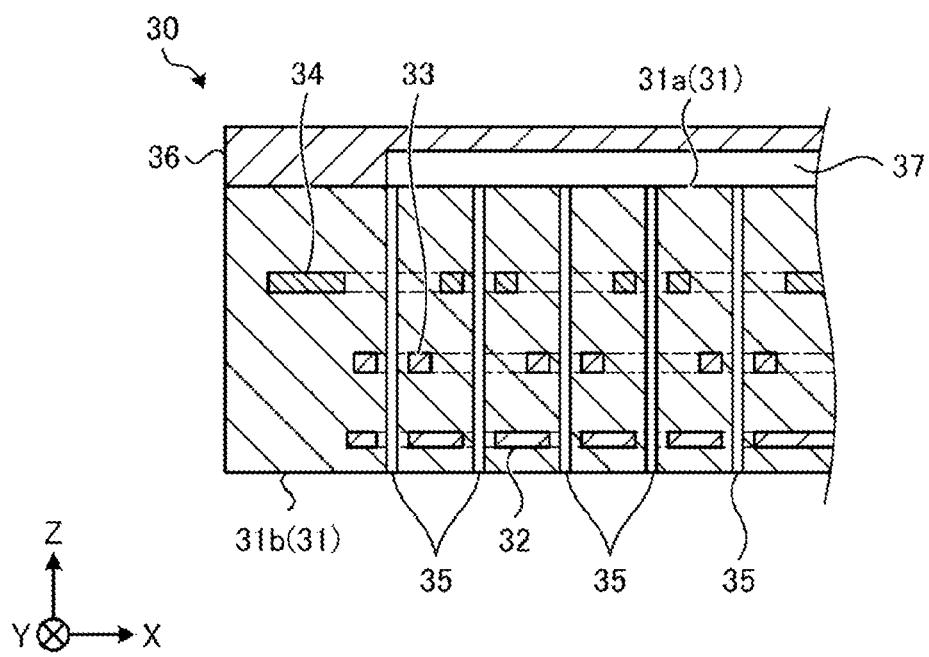
FIG. 8 is a schematic cross-sectional view illustrating a configuration of a shower head according to a second embodiment.

Next, an example of applying the plasma treatment apparatus member according to the present disclosure to the shower head 30 is described. FIG. 8 is a schematic cross-sectional view illustrating a configuration of the shower head 30 according to a second embodiment.

As illustrated in FIG. 8, the shower head 30 according to the second embodiment includes a base 31, a plasma electrode 32, a heating element 33, and a conductive layer 34. The configuration and arrangement of the base 31, the plasma electrode 32, the heating element 33, and the conductive layer 34 are the same as, or similar to, those of the base 21, the plasma electrode 22, and the heating element 23 of the substrate support 20 of the first embodiment described above, and are therefore not described here. In an example, the plasma electrode 32, the heating element 33, and the conductive layer 34 located inside the base 31 are located in this order in order of proximity to the lower surface 31b of the base 31 which corresponds to the surface facing the substrate W. The heating element 33 and the conductive layer 34 may be warped like the heating element 23 and the conductive layer 24 illustrated in FIGS. 4 to 7.

The shower head 30 according to the second embodiment includes a plurality of ejection holes 35 and an introduction portion 36. The plurality of ejection holes 35 open in the lower surface 31b of the base 31 and eject a process gas supplied from the process gas supply source 54 (see FIG. 1). In the example illustrated in FIG. 8, the plurality of ejection holes 35 are through holes penetrating the upper surface 31a and the lower surface 31b of the base 31.

The introduction portion 36 is made of, for example, a ceramic and connected to the upper surface 31a of the base 31. The introduction portion 36 is provided with a recessed portion on a surface facing the upper surface 31a of the base 31, and a flow path 37 is formed between the recessed portion and the upper surface 31a of the base 31. The flow path 37 extends along the upper surface 31a of the base 31 and is connected to the gas supply pipe 51 (see FIG. 1) and then to the plurality of ejection holes 35. The process gas supplied from the process gas supply source 54 is introduced into the plurality of ejection holes 35 via the gas supply pipe 51 and the flow path 37. Then, the plurality of ejection holes 35 eject the introduced process gas into the chamber 10.

The shower head 30 does not necessarily include the introduction portion 36. For example, the plurality of ejection holes 35 may be respectively connected to a plurality of branch pipes branched from the gas supply pipe 51.

Variation of Second Embodiment

Figure 9:
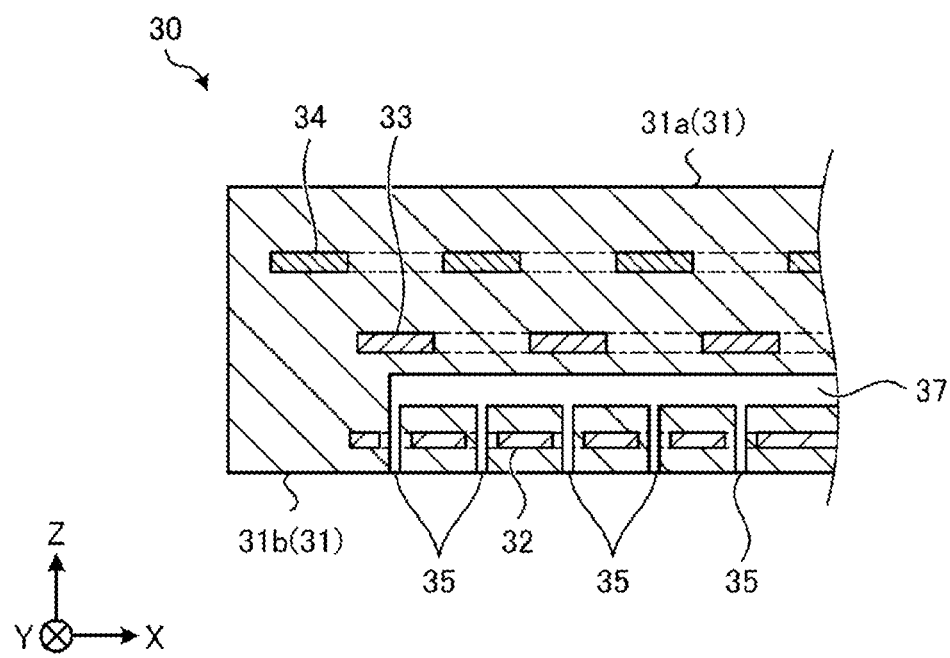
FIG. 9 is a schematic cross-sectional view illustrating another configuration example of the shower head according to the second embodiment.
Figure 10:
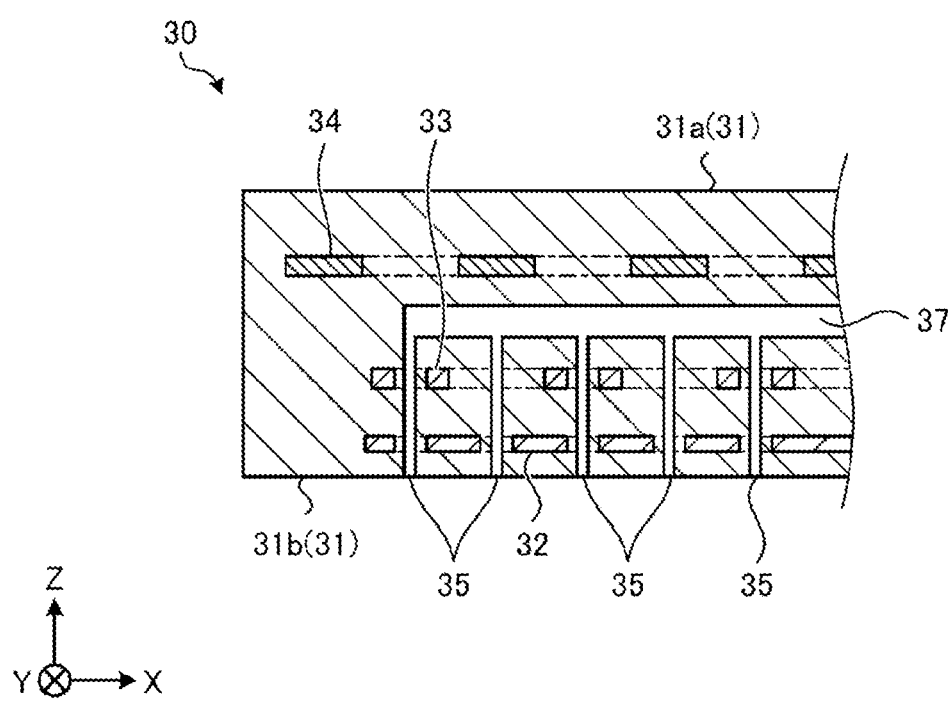
FIG. 10 is a schematic cross-sectional view illustrating another configuration example of the shower head according to the second embodiment.

The shower head 30 may include the flow path 37 inside the base 31. This case is described with reference to FIGS. 9 and 10. FIGS. 9 and 10 are schematic cross-sectional views each illustrating another configuration example of the shower head 30 according to the second embodiment.

For example, as illustrated in FIG. 9, the flow path 37 may be located between the plasma electrode 32, and the heating element 33 and the conductive layer 34. In the example illustrated in FIG. 9, the flow path 37 is located between the plasma electrode 32 and the heating element 33. In a case in which the plasma electrode 32, the heating element 33, and the conductive layer 34 are located in order of the plasma electrode 32, the conductive layer 34, and the heating element 33, in order of proximity to the lower surface 31b of the base 31, the flow path 37 may be located between the plasma electrode 32 and the conductive layer 34.

As illustrated in FIG. 10, the flow path 37 may be located between the heating element 33 and the conductive layer 34. In such a configuration, the flow path 37 interposed between the heating element 33 and the conductive layer 34 can make it more difficult to generate leakage current between the conductive layer 34 and the heating element 33.

For example, in manufacturing the shower head 30 illustrated in FIG. 8, a sintered body of the base 31 including the plasma electrode 32, the heating element 33, and the conductive layer 34 is prepared, and then, a plurality of ejection holes 35 penetrating the upper surface 31a and the lower surface 31b of the base 31 can be formed on this sintered body by drilling or the like. For example, in manufacturing the shower head 30 illustrated in FIGS. 9 and 10, the sintered body of the base 31 including the plasma electrode 32, the heating element 33, the conductive layer 34, and the flow path 37 is prepared, and then, the lower surface 31b of the base 31 and the flow path 37 are made to communicate with each other by drilling or the like in the sintered body to form the plurality of ejection holes 35.

Although not illustrated herein, the flow path 37 may be located farther from the lower surface 31b of the base 31 than the heating element 33 and the conductive layer 34 are.

Other Embodiments

The above-mentioned second embodiment has described the example of the shower head 30 including the plurality of ejection holes 35. Alternatively, the substrate support 20 may also include a plurality of ejection holes. In other words, the substrate support 20 may include a plurality of ejection holes opened in the upper surface 21a of the base 21. In that case, the substrate support 20 can supply, for example, a cooling gas or an intermediary gas, which aids in heat transfer to the substrate W from the substrate support 20, to the substrate W through the plurality of ejection holes.

Although FIG. 3 illustrates the example in which the substrate support 20 includes a so-called single-zone heater, the substrate support 20 may include a multi-zone heater capable of individually controlling a plurality of regions on the upper surface 21a of the base 21. In that case, the substrate support 20 needs to include a plurality of heating elements 23 extending over different regions of the upper surface 21a of the base 21.

Although the above-mentioned embodiments have described the example in which the plasma treatment apparatus 1 is a capacitively coupled plasma treatment apparatus, the plasma treatment apparatus 1 may be of any type of plasma treatment apparatus, such as an inductively coupled plasma treatment apparatus or a plasma treatment apparatus in which a gas is excited by surface waves such as microwaves.

As described heretofore, the plasma treatment apparatus member (for example, the substrate support 20, the shower head 30) according to the embodiments includes the base (for example, the base 21, 31), the plasma electrode (for example, the plasma electrode 22, 32), the heating element (for example, the heating element 23, 33), and the conductive layer (for example, the conductive layer 24, 34). The base is made of a ceramic and has the facing surface (for example, the upper surface 21a of the base 21, the lower surface 31b of the base 31) facing an object to be processed (for example, the substrate W). The plasma electrode is located inside the base. The heating element and the conductive layer are located farther from the facing surface than the plasma electrode is, inside the base. The heating element and the conductive layer do not overlap each other in plan view seen from the direction orthogonal to the facing surface, and are located at different heights in side view seen from the direction parallel to the facing surface.

In the plasma treatment apparatus member according to the embodiments, the distance between the heating element and the conductive layer is larger than that in the case in which the heating element and the conductive layer overlap each other in plan view, thus suppressing the generation of leakage current between the heating element and the conductive layer.

Further effects and variations can be readily derived by those skilled in the art. Thus, a wide variety of aspects of the present invention are not limited to the specific details and a representative embodiment represented and described above. Accordingly, various changes are possible without departing from the spirit or scope of the general inventive concepts defined by the appended claims and their equivalents.

The invention claimed is:

1. A plasma treatment apparatus member comprising:
   a base made of a ceramic and comprising a facing surface facing an object to be processed;
   a plasma electrode located inside the base;
   a heating element located farther from the facing surface than the plasma electrode is, inside the base; and
   a conductive layer located farther from the facing surface than the plasma electrode is, inside the base, wherein
   the heating element and the conductive layer do not overlap each other in plan view seen from a direction orthogonal to the facing surface, and are located at different heights in side view seen from a direction parallel to the facing surface.

2. The plasma treatment apparatus member according to claim 1, wherein the conductive layer is grounded.

3. The plasma treatment apparatus member according to claim 1, wherein an outer peripheral portion of the conductive layer is located on an outer side of an outer peripheral portion of the heating element in the plan view.

4. The plasma treatment apparatus member according to claim 1, wherein an outer peripheral portion of the conductive layer is located on an outer side of an outer peripheral portion of the plasma electrode in the plan view.

5. The plasma treatment apparatus member according to claim 1, wherein the conductive layer is farther from the facing surface than the heating element is.

6. The plasma treatment apparatus member according to claim 1, further comprising a plurality of ejection holes opened in the facing surface and configured to eject a gas.

7. The plasma treatment apparatus member according to claim 6, further comprising a flow path located inside the base and connected to the plurality of ejection holes.

8. The plasma treatment apparatus member according to claim 7, wherein the flow path is located between the plasma electrode, and the heating element and the conductive layer, in a thickness direction of the base.

9. The plasma treatment apparatus member according to claim 7, wherein the flow path is located between the heating element and the conductive layer in a thickness direction of the base.

10. The plasma treatment apparatus member according to claim 1, wherein an outer peripheral portion of the conductive layer is located closer to the facing surface than a central portion of the conductive layer is.

11. The plasma treatment apparatus member according to claim 1, wherein an outer peripheral portion of the heating element is located closer to the facing surface than a central portion of the heating element is.

12. The plasma treatment apparatus member according to claim 1, wherein an outer peripheral portion of the heating element and an outer peripheral portion of the conductive layer are located closer to the facing surface than a central portion of the heating element and a central portion of the conductive layer area.

13. The plasma treatment apparatus member according to claim 1, wherein
   the heating element has a first pattern shape,
   the conductive layer has a second pattern shape, and
   the second pattern shape of the conductive layer is located in a gap in the first pattern shape of the heating element.

* * * * *